(12) United States Patent
Olson et al.

(10) Patent No.: US 10,069,029 B1
(45) Date of Patent: Sep. 4, 2018

(54) TRANSFER-PRINTED PHOTONICS

(71) Applicant: Seagate Technology LLC, Cupertino, CA (US)

(72) Inventors: Scott Eugene Olson, Eagan, MN (US); Roger L. Hipwell, Jr., Eden Prairie, MN (US)

(73) Assignee: Seagate Technology LLC, Cupertino, CA (US)

(*) Notice: Subject to any disclaimer, the term of this patent is extended or adjusted under 35 U.S.C. 154(b) by 0 days.

(21) Appl. No.: 14/946,309

(22) Filed: Nov. 19, 2015

Related U.S. Application Data

(60) Provisional application No. 62/081,855, filed on Nov. 19, 2014.

(51) Int. Cl.
G02B 6/00 (2006.01)
B82Y 20/00 (2011.01)
H01L 31/18 (2006.01)
G02F 1/09 (2006.01)
G11B 5/127 (2006.01)
H01L 31/0232 (2014.01)
H01L 31/167 (2006.01)
G11B 5/00 (2006.01)

(52) U.S. Cl.
CPC .............. H01L 31/18 (2013.01); G02F 1/093 (2013.01); G11B 5/1272 (2013.01); H01L 31/02327 (2013.01); H01L 31/167 (2013.01); G11B 2005/0021 (2013.01)

(58) Field of Classification Search
CPC . H01L 27/3269; H01L 27/00; H01L 51/5275; G02B 6/00
See application file for complete search history.

(56) References Cited

U.S. PATENT DOCUMENTS

| | | | |
|---|---|---|---|
| 6,294,450 B1 | 9/2001 | Chen et al. | |
| 7,622,367 B1 | 11/2009 | Nuzzo et al. | |
| 7,972,875 B2 | 7/2011 | Rogers et al. | |
| 7,998,330 B2 | 8/2011 | Fang et al. | |
| 8,261,660 B2 | 9/2012 | Menard | |
| 8,333,860 B1 | 12/2012 | Bibl et al. | |
| 8,456,969 B1 | 6/2013 | Mooney et al. | |
| 8,501,536 B2 | 8/2013 | Mooney et al. | |
| 8,518,204 B2 | 8/2013 | Hu et al. | |
| 9,105,286 B2 | 8/2015 | Boone, Jr. | |
| 2007/0215480 A1 | 9/2007 | Fang et al. | |
| 2009/0217517 A1 | 9/2009 | Pique et al. | |
| 2010/0283069 A1* | 11/2010 | Rogers | H01L 21/00 257/98 |
| 2011/0018158 A1 | 1/2011 | Menard | |
| 2011/0138600 A1* | 6/2011 | Oggioni | G02B 6/43 29/428 |
| 2011/0216635 A1* | 9/2011 | Matsumoto | G11B 5/105 369/13.33 |

(Continued)

OTHER PUBLICATIONS

Stadler et al., "Integrated Magneto-Optical Materials and Isolators: A Review", IEEE Phototonics Journal, 2013, 16 pages.

Primary Examiner — Mohammad Choudhry
(74) Attorney, Agent, or Firm — Hollingsworth Davis, LLC

(57) ABSTRACT

A device such as a photo sensor, an optical isolator, and an optical damper is formed via a first process. The device is transfer printed to a waveguide of a read/write head in a second process.

19 Claims, 5 Drawing Sheets

(56) References Cited

U.S. PATENT DOCUMENTS

| | | | | |
|---|---|---|---|---|
| 2013/0230071 A1* | 9/2013 | Haensel | ............. | H01S 3/06791 |
| | | | | 372/70 |
| 2013/0316487 A1* | 11/2013 | de Graff | ........... | H01L 27/14683 |
| | | | | 438/66 |
| 2013/0330853 A1 | 12/2013 | Tischler | | |
| 2014/0241137 A1* | 8/2014 | Jin | ....................... | G11B 5/4866 |
| | | | | 369/13.14 |
| 2014/0373898 A1 | 12/2014 | Rogers et al. | | |
| 2016/0195676 A1* | 7/2016 | Yu | ........................ | G02B 6/1226 |
| | | | | 385/11 |

\* cited by examiner

Section A-A

TRANSFER-PRINTED PHOTONICS

RELATED PATENT DOCUMENTS

This application claims the benefit of Provisional Patent Application Ser. No. 62/081,855 filed on Nov. 19, 2014, to which priority is claimed pursuant to 35 U.S.C. § 119(e), and which is incorporated herein by reference in its entirety.

SUMMARY

The present disclosure is related to transfer-printed photonics. In one embodiment, a device such as a photo sensor, an optical isolator, and an optical damper is formed via a first process. The device is transfer printed to a waveguide of a read/write head in a second process.

In another embodiment, a material stack is created on a donor substrate. The material stack has at least two of a material layer, an adhesion layer, a protection layer, a carrier layer, a bonding layer, and planarization stop material layer. The material layer includes one of a photo sensor material, an optical isolator material, and an optical damper. Islands are formed from the material stack, the islands being used to form a plurality of read/write head components. The islands are transfer-printed to a wafer having a plurality of read/write heads.

These and other features and aspects of various embodiments may be understood in view of the following detailed discussion and accompanying drawings.

BRIEF DESCRIPTION OF THE DRAWINGS

In the following diagrams, the same reference numbers may be used to identify similar/same/analogous components in multiple figures. The figures are not necessarily to scale.

DETAILED DESCRIPTION

Figure 1:
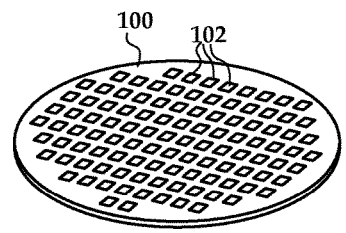
FIGS. 1-5 are diagrams showing a transfer printing process according to an example embodiment.

In the following description, reference is made to the accompanying set of drawings that form a part of the description hereof and in which are shown by way of illustration of several specific embodiments. It is to be understood that other embodiments are contemplated and may be made without departing from the scope of the present invention. The following detailed description, therefore, is not to be taken in a limiting sense.

This disclosure relates to read/write heads used in heat-assisted magnetic recording (HAMR), also referred to as thermally-assisted recording (TAR), thermally-assisted magnetic recording (TAMR), energy-assisted magnetic recording (EAMR), etc. In this disclosure the terms "read/write head," "slider," "recording head", and "head" will be used interchangeably. In a HAMR device, a read/write head includes an energy source (e.g., a laser diode) that heats a recording medium during writing. The HAMR read/write head generally includes some form of optical transmission path, such as a waveguide and near-field transducer (NFT), which shapes and directs the energy from the energy source to the recording medium.

One issue that this disclosure addresses is that the output from a laser diode into photonics devices (for example, photo sensors, optical isolators, photodiodes, thermo-optic sensors, modulators, absorbers, saturable transmitters, etc.) may require sub-wavelength alignment of the laser active region to the acceptance pupil of the photonic elements to ensure high coupling efficiency and optimum performance. In some current implementations, the laser is formed separately as a packaged device and attached to the read/write head, e.g., via solder and/or bonding materials. The optical alignment in such an assembly is sensitive to both the tolerances of the separate devices, as well as the processes which join the devices together.

This disclosure describes how transfer printing may enable precise alignment of integrated photonics with other optical components of a HAMR read/write head, e.g., waveguide, laser, NFT, etc. Transfer printing generally involves transferring non-self-supporting, growth-incompatible layers to a substrate, and be referred to as transfer printing, dry transfer printing, nanoprinting, etc. The transfer printing of the optical components allows the use of materials that might not otherwise be deposited on the slider substrate, and these materials can be subsequently processed using photolithography (e.g., etching) to ensure precision alignment. This is similar to methods enabling on-wafer lasers (OWL), which involves transfer printing crystalline laser materials (e.g., epitaxial layers) to a head substrate and post-processing the layers to form an integrated laser device. The integrated-photonics-forming processes described herein can be used in combination with OWL assembly processes.

In the present disclosure, hard drive recording heads are proposed onto which a structure (e.g., photo sensors, optical isolators, photodiodes, thermo-optic sensors, modulators, absorbers, saturable transmitters) is attached without the use of a separate or intermediate support during attachment. Such structures may be incompatible with growth on the substrate, or may be print-transferred for other reasons (e.g., structures are formed using high temperature processes incompatible with slider processing). As such, the device cannot be formed using the same layer deposition processes used to form the magnetic and optical components that are integrated into the head. In embodiments described below, an integrated optics device may instead be formed on the substrate by transfer printing a thin, non-self-supporting layer, or a stack of such layers, from a growth substrate on which they were formed to a target substrate. Thereafter, the transferred layer and substrate may be further processed (e.g., masked etched, further layers added) to form the rest of the recording head.

Transfer printing the grown, partially pre-fabricated or raw materials onto surfaces that are precisely aligned to the laser output or intermediate coupler elements, and processing the elements simultaneously at a wafer level enables this alignment to much less than a wavelength. Photonic integrated circuits utilize wafer level processing, but these are typically homogenous elements (e.g., created on a single InP substrate/platform). In the present embodiments, components consisting of widely varying materials with sometimes incompatible prefabrication requirements may be precisely integrated together on a slider optical wafer platform for efficient integration with near-field transducer elements.

In FIGS. 1-5, block diagrams illustrate transfer printing of components onto a recording head according to an example embodiment. In FIG. 1, a donor substrate 100 includes a number of components 102 (e.g., integrated photonics devices) formed using a first process (e.g., crystalline growth, high temperature process). The components 102 may include one or more layers of materials that have been processed via photolithography and/or other processes to attain a final shape and position on the substrate 100. A sacrificial layer may also be included between the components 102 and the substrate 100 to allow separation. This fabrication could include some or all of the following: target material layer, adhesion or protection layers, carrier layers (to increase thickness for easier transport), bonding layers to aid in best print transfer, and integration layers to enable subsequent integration (e.g., stop material to allow planarization after integration).

Figure 2:
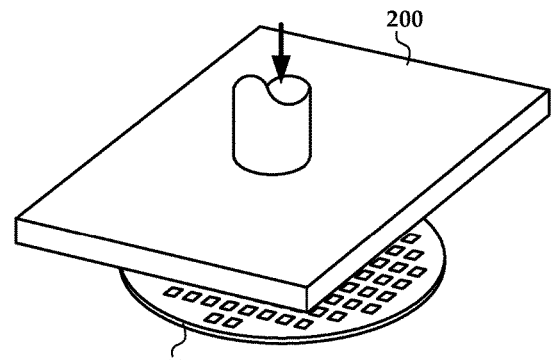
Figure 3:
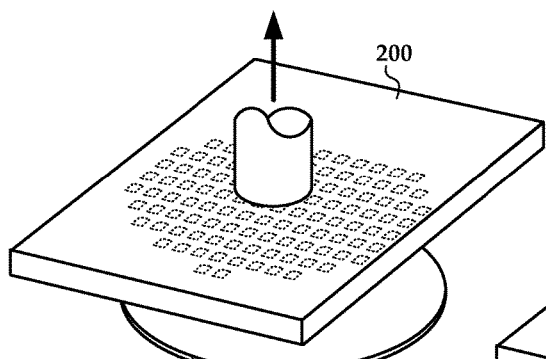
Figure 4:
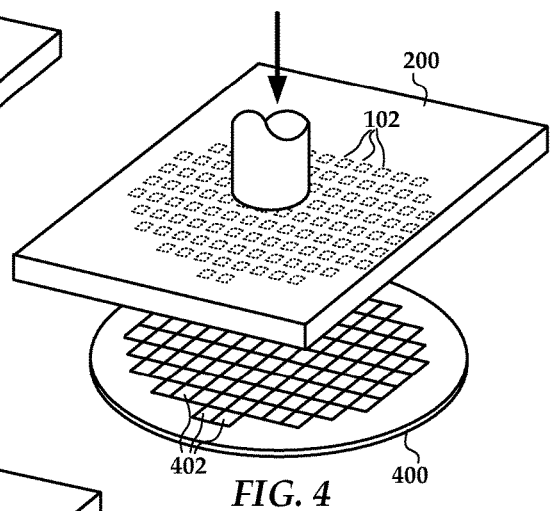
Figure 5:
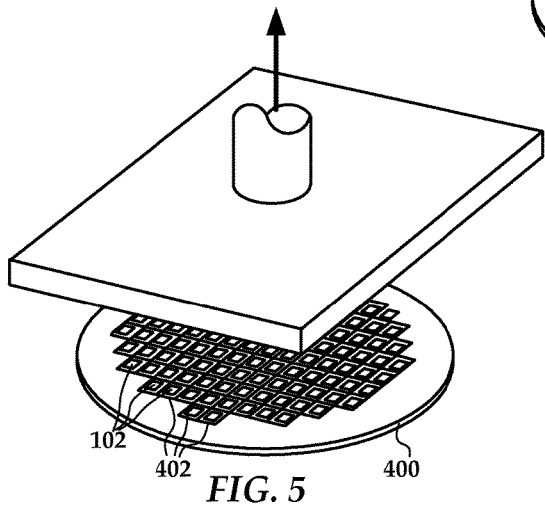

As seen in FIG. 2, a transfer print head 200 is lowered onto the substrate material (or material stack) onto a target substrate (typically of a different material). The transfer print head 200 is lifted as shown in FIG. 3, taking the components 102 with it. In this way, "islands" of the component material are then transferred to a target substrate 400 as shown in FIGS. 4-5. As seen in FIG. 4, the transfer print head 200 is lowered over a wafer 400 that includes a number of partially-processed recording heads 402. The transfer print head 200 presses the components 102 on to the wafer 400 and is then pulled away as seen in FIG. 5. This attaches the components 102 to the recording heads 402. Afterwards, the wafer 400 is further processed, e.g., etching the components 102 to final shape and alignment, and adding additional layers of material to form additional recording head components. Examples of devices that may be attached to a recording head in this way are shown in FIGS. 6-10.

Figure 6:
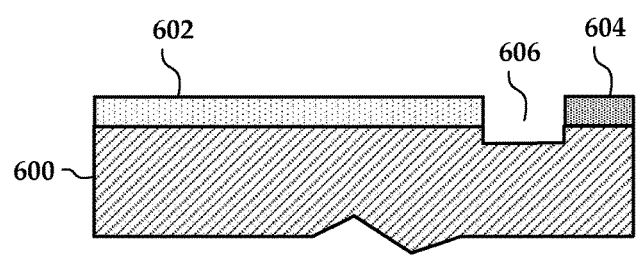
FIG. 6 is a side view showing a slider-integrated photodiode or optical damper according to an example embodiment.

In FIG. 6, a side view shows a slider-integrated photodiode or optical damper according to an example embodiment. A laser 602 (or at least an active layer thereof) is deposited on a slider substrate 600. A component 604 is deposited on the substrate 600 via transfer printing. The laser 602 may formed together with the component 604 on the same donor substrate and transferred together, the laser 602 may be formed on a different donor substrate and transferred during a different transfer-printing step, or the laser 602 may be attached/formed using a non-transfer printing process.

In one embodiment, the component 604 includes a saturable transmitter that is transparent until a threshold level is met. For example, the component 604 may be formed from a thick magneto-optical garnet film that is grown on a garnet substrate and then transfer-printed to the substrate 600. This type of component may be referred to as an optical damper, optical isolator, optical stabilizer, feedback isolator, etc. The component allows transmittal of the light from the laser 602 but blocks reflections that can cause laser instability or other negative effects (e.g., cancellation, laser intensity noise, laser mode-hopping, optical frequency spectrum disorder). After deposition of the component 604 and the laser 602, a notch 606 can be etched through one or both of the components 602, 604 to precisely define the separation therebetween.

In another embodiment, the component 604 may include a photodiode that senses an output level of the laser 602. Output of the photodiode can be used, e.g., for control of laser power levels and determination of laser health. As with the previous example, the notch 606 can be formed after attachment of the laser 602 and component 604 to accurately define separation therebetween.

Figure 7:
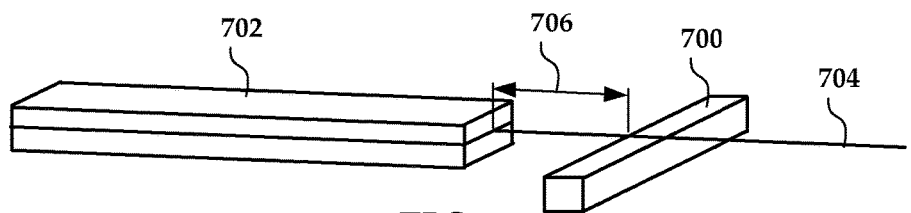
FIG. 7 is a perspective view showing a slider-integrated bolometer according to an example embodiment.

In FIG. 7, a perspective view shows slider-integrated bolometer 700 according to an example embodiment. The bolometer 700 can be transfer-printed onto a slider substrate (not shown) and used to detect an output 704 of a laser 702. Generally the output 704 is a laser emission coupled into a waveguide (not shown). The bolometer 700 may be configured as a wire with a temperature-dependent electrical resistance that can measure the power of incident electromagnetic radiation via heating of the wire. As above, the laser 702 may also be attached to the substrate via a transfer-printing, or using some other process. Post-attachment processing of the laser 702 and/or bolometer 700 may include etching or the like to precisely define longitudinal separation distance 706. Post-attachment processing may also include precisely defining a vertical alignment between the laser 702 an bolometer, such as planarizing the bolometer 700 so that is close enough to the output 704 to be heated sufficiently without interfering with the output 704.

Figure 8A:
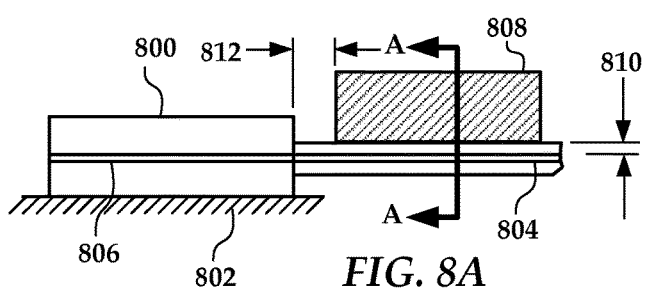
FIGS. 8A and 8B are cross-sectional views showing an optical isolation device according to another example embodiment.
Figure 8B:
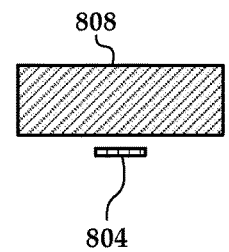

In FIGS. 8A and 8B, cross-sectional views show an optical isolation or damping device 808 according to another example embodiment. A laser 800 is attached to a substrate 802 of a read/write head. An active region 806 of the laser 800 emits light that is coupled to core 804 of waveguide. The optical isolation or damping device 808 is transfer-printed onto the waveguide. In one example, the device 808 includes an isolator such as Faraday rotator that reduces reflections back to the laser 800. In another example, the device 808 includes an optical damper such a non-linear mirror that limits or squelches transmission peaks. The isolation or damping 808 is vertically separated from the core 804 by a separation distance 810 and longitudinally separated from the laser 800 by a longitudinal distance 812. Both of these distances 810, 812 can be defined by post-attachment planarization and post-attachment etching as described above.

Figure 8C:
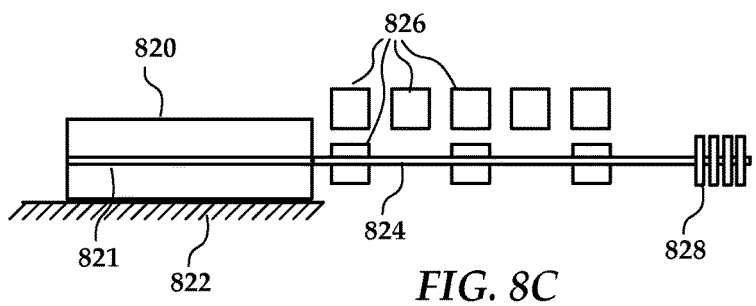
FIG. 8C is a cross-sectional view showing an optical isolation device according to another example embodiment.

In FIG. 8C, a cross-sectional view shows an optical isolation device according to another example embodiment. A laser 820 is attached to a substrate 1002 of a read/write head. An active region 821 of the laser 820 emits light that is coupled to core 824 of waveguide. A series of Faraday rotators 826 form a periodic structure. A grating structure 828 can be used to further stabilize the laser 820. The rotators 826 and grating 828 may be transfer-printed and further processed after attachment to precisely define dimensions of the resulting structures.

Figure 8D:
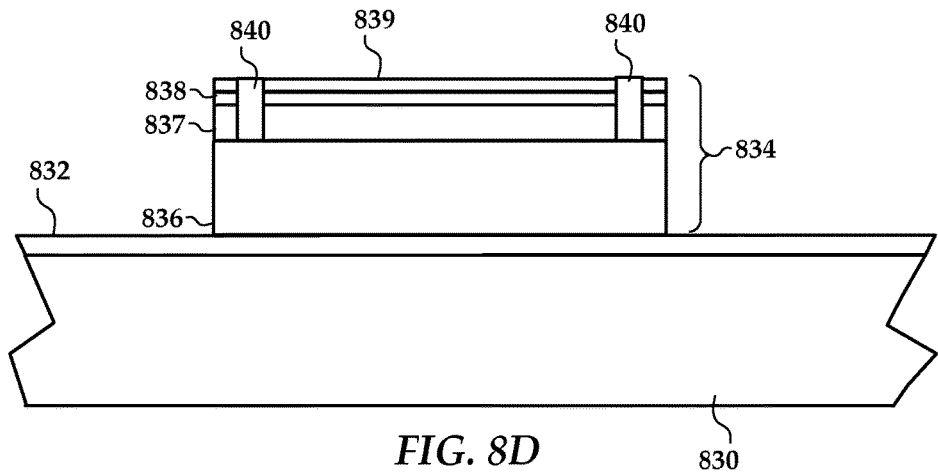
FIG. 8D is a block diagram illustrating layers of a donor substrate and associated components according to an example embodiment.

As previously noted, transfer printed components may include a number of layers and be first formed on a donor substrate. In FIG. 8D, a block diagram illustrates layers of a donor substrate 830 and associated components according to an example embodiment. A sacrificial layer 832 is between the substrate 830 and a transfer-print component 834 and facilitates separation under some condition (e.g., temperature, electrical charge, etc. The component 834 includes a carrier layer 836 (e.g., to increase thickness for easier transport after separation from the sacrificial layer 832), a material layer 837 (e.g., with bolometer material, Faraday rotator material, etc.), adhesion or protection layers 838, a bonding layer 839 to aid in best print transfer, and integration layers/features 840 to enable subsequent integration (e.g., stop material to allow planarization after integration).

It will be understood that any combination of the layers 836-840 may be used, such at least one of the layers is the material layer 836. The component 834 may be shaped and/or aligned (e.g., via etching) on the donor substrate 830. For example, the component 834 may be formed as an island after depositing layers 836-840 over the entire substrate 830. The component 834 may also be shaped and/or aligned (e.g., via etching) after transfer to a read/write head. The component 834 may include multiple functional components, e.g., including both a laser active layer, an output sensing device, and/or a feedback stabilizer.

Figure 9:
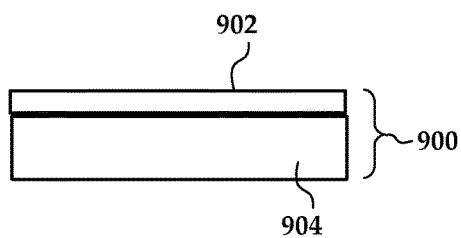
FIGS. 9-13 are diagrams illustrating a transfer printing process according to another example embodiment.

The transfer printing described above allows batch transfer "islands" of material that couldn't be formed on the target AlTiC read/write head substrate (e.g., due to temperature or crystal structure limitations). This enables a wide range of potential material choices that might create optical devices that perform beyond what is capable using existing photo resistive techniques alone. In FIGS. 9-13, block diagrams illustrate details of a transfer printing process according to another example embodiment. The side view of FIG. 9 shows a template wafer 900 with a material layer 902 deposited on a second layer 904 (e.g., adhesion layer, protection layer, carrier layer, bonding layer, and chemical mechanical planarization stop material layer). In an example implementation, the material layer 902 is deposited on a second layer 904 at a temperature that exceeds that which the reader will tolerate. The relatively thick second layer 904 provides a surface on which the material layer 902 may be deposited and facilitates transportation of the relatively thin material layer 902 without damaging the material layer 902. Further, the material layer 902 may be deposited on a template substrate 904 at a relatively high temperature (e.g., up to 900 Celsius) that may damage other magnetic components of a recording head wafer (see recording head wafer 1200 of FIG. 12) if applied directly to the recording head wafer.

Figure 10:
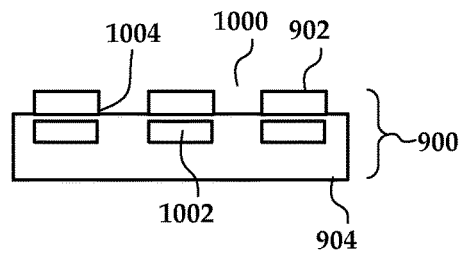

The side view of FIG. 10 the template wafer 900 of FIG. 9 with the material layer 902 patterned into islands with etched voids underneath. In one implementation, etching streets (e.g., etching street 1000) are patterned (e.g., using photolithography) in a continuous or non-continuous grid pattern in the material layer 902, which forms the islands. Further, a majority of the second layer 904 is etched away immediately underneath each of the islands using the etching streets as access to the underside of the islands. The etching creates the etched voids (e.g., void 1002) underneath the islands. Some of the template substrate 904 immediately underneath each of the islands may remain to keep the islands in place. This remaining material may be referred to as an anchor tab(s) (e.g., anchor tab 1004). In other implementations, a release layer oriented between the material layer 902 and the second layer 904 is used in addition or in lieu of to the patterning and/or etching illustrated in FIG. 10.

Figure 11:
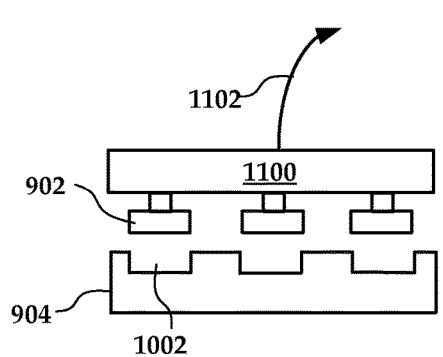

In FIG. 11, a side view illustrates a flexible stamp 1100 attached to and pulling the individual islands of the material layer 902 away from the template substrate 904 of FIG. 10. The flexible stamp 1100 is loosely bonded, e.g., via surface forces and viscoelastic adhesion dependence on velocity of the stamp such that slow movement will cause the islands to adhere to the stamp and allow transfer from the source wafer and fast movement of the stamp will leave the islands adhering to the target substrate, that allows it to be removably attached to the individual islands of the material layer 902. The stamp 1100 lifts the individual islands of the material layer 902 from the template substrate 904, as illustrated by arrow 1102. Other more active methods of bonding could also be used.

The etched voids facilitate the removal of the individual islands of the material layer 902 from the template wafer 900 by providing very little of the template substrate 904 remaining immediately beneath each of the individual islands of the material layer 902. In one implementation, a separation force is applied to the stamp 1100 and the template substrate 904, which is sufficient to break the anchor tab(s) connecting the individual islands of the material layer 902 to the template substrate 904. However, the separation force is insufficient to remove the individual islands of the material layer 902 from the stamp 1100.

Figure 12:
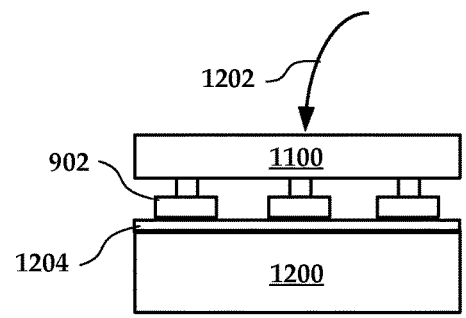

In FIG. 12, a side view illustrates the flexible stamp 1100 placing the individual islands of the material layer 902 of FIG. 9 onto a recording head wafer 1200, as illustrated by arrow 1202. The material layer 902 islands are then bonded or stamped to the recording head wafer 1200. For example, the recording head wafer 1200 may include an adhesive layer 1204 that bonds the material layer 902 islands to the recording head wafer 1200 on contact, with the application of pressure, and/or with the application of an elevated temperature. In other implementations, the material layer 902 islands are directly bonded to the recording head wafer 1200 without the adhesive layer 1204. This process may occur at temperatures within that which the reader will tolerate (e.g., less than 220 degrees Celsius).

Figure 13:
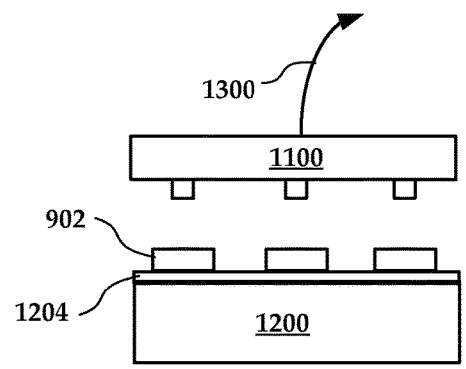

In FIG. 13, a side view illustrates the individual islands of the material layer 902 bonded to the amorphous recording head wafer 1200 of FIG. 10 with the flexible stamp 1100 removed, as illustrated by arrow 1300. The flexible stamp 1100 is released from the material layer 902, which leaves the individual islands for the material layer 902 attached to the recording head wafer 1200 via the adhesive layer 1204. In one implementation, a separation force is applied to the stamp 1100 and the recording head wafer 1200, which is sufficient to break the bonds connecting the individual islands of the material layer 902 to the stamp 1100. However, the separation force is insufficient to remove the individual islands of the material layer 902 from the recording head wafer 1200.

The technique illustrated by FIGS. 9-13 may be referred to herein as a hybrid pick-and-place bonding technique. In some embodiments, the recording head wafer 1200 may have a significantly different area than the template wafer 900 (e.g., the template wafer may be a 4-inch circular wafer, while the recording head wafer 1200 may be an 8-inch circular wafer). Since the flexible stamp 1100 may be used to place the islands of the material layer 902 on the recording head wafer 1200 multiple times at different places on the surface of the recording head wafer 1200, the technique illustrated by FIGS. 7-11 may be used with a variety of template and recording head wafer sizes.

Figure 14:
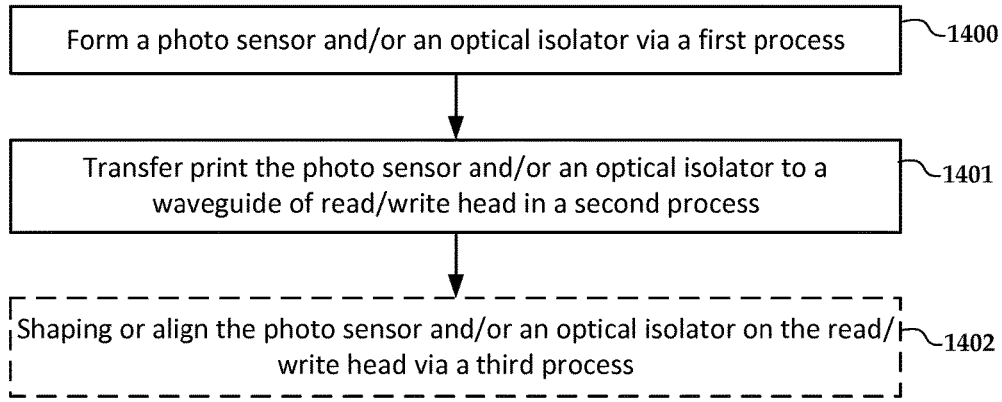
FIGS. 14 and 15 are flowcharts of methods according to example embodiments.

In FIG. 14, a flowchart shows a method according to an example embodiment. The method involves forming 1400 a photo sensor and/or an optical isolator via a first process. The first process may include a high-temperature process, high temperature deposition, rapid thermal anneal spike annealing, laser annealing, current-induced heating, etc. The photo sensor may include a photodiode, bolometer, etc. The optical isolator may include a Faraday rotator. The photo sensor and/or an optical isolator is transfer-printed 1401 to a read/write head in a second process. The photo sensor and/or an optical isolator may be optionally shaped and/or aligned on the read/write head via a third process (e.g., photolithography, planarization). Other processes may be subsequently performed, such as depositing additional material layers (e.g., dielectrics, metals) and shaping the additional material layers to form additional read/write head components.

Figure 15:
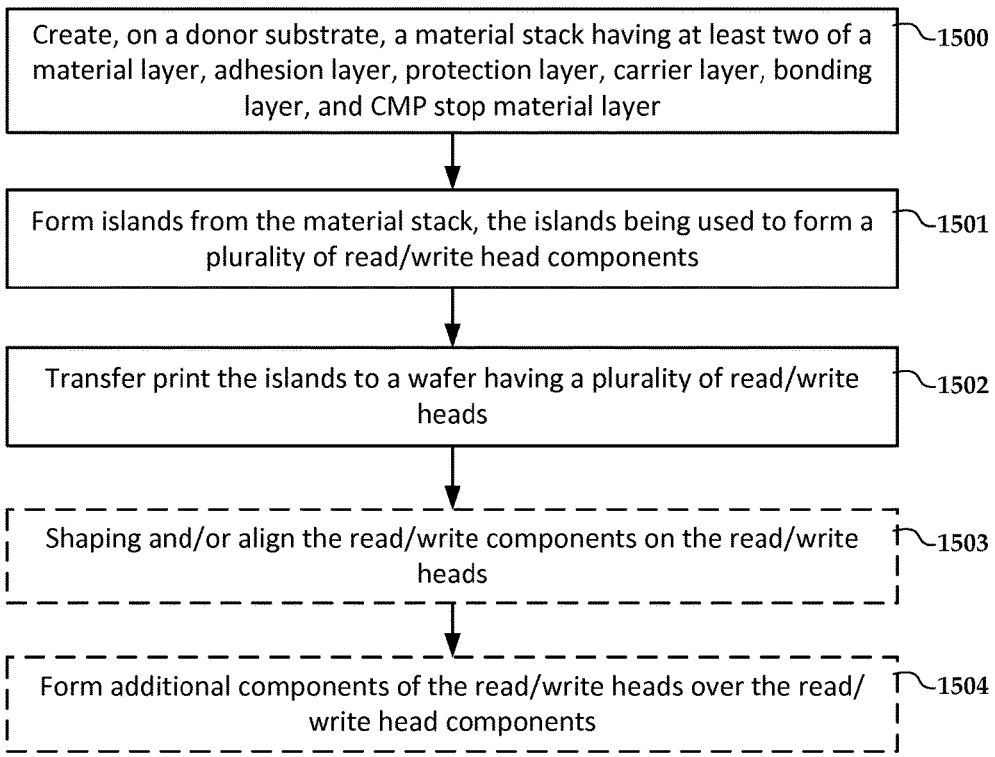

In FIG. 15, a flowchart shows a method according to another example embodiment. The method involves, creating 1500, on a donor substrate, a material stack having at least two of a material layer, an adhesion layer, a protection layer, a carrier layer, a bonding layer, and planarization stop material layer. The material layer includes one of a photo sensor material and an optical isolator material. Islands are formed 1501 from the material stack, the islands being used to form a plurality of read/write head components. The islands are transfer-printed 1502 to a wafer having a plurality of read/write heads.

The method shown in FIG. 15 may optionally include shaping or aligning 1503 the read/write head components on the read/write head after the transfer printing, e.g., using photolithography. The method may further optionally include forming 1504 additional components of the read/write heads over the read/write head components, e.g., using photolithography. Examples of such additional components include read transducers, write transducers, waveguide, bond pads, etc.

Although the subject matter has been described in language specific to structural features and/or methodological acts, it is to be understood that the subject matter defined in the appended claims is not necessarily limited to the specific features or acts described above. Rather, the specific features and acts described above are disclosed as representative forms of implementing the claims.

What is claimed is:

1. A method comprising:
   forming a photo sensor via a first process;
   transfer printing the photo sensor proximate to a waveguide of a heat-assisted magnetic recording read/write head in a second process, the photo sensor being vertically separated from the waveguide; and
   aligning the photo sensor on the read/write head via a third process after the second process, the alignment resulting in a laser sub-wavelength precision in one of a longitudinal separation between the photo sensor and a laser and the vertical separation between the waveguide and the photo sensor.

2. The method of claim 1, wherein the first process comprises a high temperature process that exceeds 220 degrees Celsius.

3. The method of claim 1, wherein the photo sensor comprises a photodiode.

4. The method of claim 1, wherein the photo sensor comprises a bolometer.

5. The method of claim 1, wherein the first process comprises forming, on a donor substrate, a material stack comprising of at least two of a material layer, adhesion layer, protection layer, carrier layer, bonding layer, and chemical mechanical planarization stop material layer.

6. The method of claim 5, wherein the first process further comprises forming islands of the material stack, one of the islands corresponding to the photo sensor, and wherein the second process comprises transfer printing the island to the read/write head.

7. The method of claim 1, wherein the first and second processes are performed for a plurality of photo sensors, the second process comprising transfer printing the plurality of photo sensors to a wafer comprising a plurality of read/write heads.

8. The method of claim 1, wherein the third process comprises an etching that defines the longitudinal separation between the photo sensor and the laser.

9. The method of claim 1, wherein the third process comprises a planarization that defines the vertical separation between the photo sensor and the waveguide.

10. A method comprising:
    forming an optical isolator or optical damper via a first process;
    transfer printing the optical isolator to a waveguide of a heat-assisted magnetic recording read/write head in a second process, the optical isolator or optical damper being vertically separated from the waveguide; and
    aligning the optical isolator or optical damper on the read/write head via a third process after the second process, the alignment resulting in a sub-wavelength precision in one of a longitudinal separation between the optical isolator or optical damper and the waveguide and the vertical separation between the waveguide and the optical isolator or optical damper.

11. The method of claim 10, wherein the optical isolator or damper includes a non-linear mirror.

12. The method of claim 10, wherein the optical isolator or damper comprises a Faraday rotator material.

13. The method of claim 10, wherein the first process comprises forming, on a donor substrate, a material stack comprising of at least two of a material layer, adhesion layer, protection layer, carrier layer, bonding layer, and chemical mechanical planarization stop material layer.

14. The method of claim 10, wherein the third process comprises an etching that defines a longitudinal separation between the optical isolator and a laser.

15. The method of claim 10, wherein the third process comprises a planarization that defines a vertical separation between the optical isolator or optical damper and a laser.

16. A method comprising:
    creating, on a donor substrate, a material stack having at least two of a material layer, an adhesion layer, a protection layer, a carrier layer, a bonding layer, and planarization stop material layer, the material layer comprising one of a photo sensor material, an optical isolator material, and an optical damper;
    forming islands from the material stack, the islands being used to form a plurality of read/write head components;
    transfer printing the islands to a wafer having a plurality of heat-assisted magnetic recording read/write heads, the islands being proximate to and vertically separated from waveguides of the read/write heads; and
    using photolithography, shaping or aligning the read/write head components on the read/write head after the transfer printing, the shaping or aligning resulting in a sub-wavelength precision in one of a longitudinal separation between the photo sensor and the waveguide and the vertical separation between the waveguide and the photo sensor.

17. The method of claim 16, wherein the components are integrated with waveguides of the read/write heads.

18. The method of claim 1, wherein the photo sensor comprises a structure that is incompatible with growth on a substrate of the read/write head.

19. The method of claim 1, wherein the waveguide of the read/write head is formed on an AlTiC substrate.

* * * * *